(12) United States Patent
Hahn et al.

(10) Patent No.: US 7,291,509 B2
(45) Date of Patent: Nov. 6, 2007

(54) METHOD FOR FABRICATING A PLURALITY OF SEMICONDUCTOR CHIPS

(75) Inventors: Berthold Hahn, Hemau (DE); Volker Harle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/835,732

(22) Filed: Apr. 30, 2004

(65) Prior Publication Data
US 2005/0003572 A1 Jan. 6, 2005

(30) Foreign Application Priority Data
Apr. 30, 2003 (DE) .................. 103 19 573
Jun. 18, 2003 (DE) .................. 103 27 612

(51) Int. Cl.
*H01L 21/00* (2006.01)
(52) U.S. Cl. ............................................. 438/33
(58) Field of Classification Search ........... 438/462, 438/33, 68
See application file for complete search history.

(56) References Cited

U.S. PATENT DOCUMENTS

| | | | | |
|---|---|---|---|---|
| 5,828,088 A * | 10/1998 | Mauk | ........................... | 257/98 |
| 6,156,584 A | 12/2000 | Itoh et al. | | |
| 6,252,261 B1 * | 6/2001 | Usui et al. | .................. | 257/190 |
| 6,325,850 B1 * | 12/2001 | Beaumont et al. | ............. | 117/95 |
| 6,377,596 B1 * | 4/2002 | Tanaka et al. | ........... | 372/45.01 |
| 6,482,666 B1 * | 11/2002 | Kobayashi et al. | ............ | 438/33 |
| 6,670,204 B2 * | 12/2003 | Tanabe et al. | .................. | 438/22 |
| 6,815,241 B2 * | 11/2004 | Wang | ............................. | 438/46 |
| 6,818,463 B2 * | 11/2004 | Biwa et al. | ..................... | 438/21 |
| 2001/0007242 A1 * | 7/2001 | Davis et al. | ................. | 117/104 |
| 2002/0038870 A1 * | 4/2002 | Kunisato et al. | ............... | 257/85 |
| 2003/0001238 A1 * | 1/2003 | Ban | ............................ | 257/627 |
| 2004/0192016 A1 * | 9/2004 | Harle et al. | .................. | 438/584 |

FOREIGN PATENT DOCUMENTS

DE 102 18 498 A1 11/2003

(Continued)

OTHER PUBLICATIONS

JPO Machine translation of 2000-174334.*

(Continued)

*Primary Examiner*—B. William Baumeister
*Assistant Examiner*—Matthew L. Reames
(74) *Attorney, Agent, or Firm*—Cohen Pontani Lieberman & Pavane LLP

(57) ABSTRACT

A semiconductor material (5) is grown in the windows (4) of a patterned mask layer (3) on a substrate (1). The semiconductor material (5) grows together over the mask layer (3) with semiconductor material (5) from adjacent windows to form a largely planar surface (7), which is suitable for the further growth of a component layer sequence (9). Through the choice of a substrate (1) having a smaller thermal expansion coefficient than the semiconductor material (5), particularly strong tensile stresses occur in the semiconductor material (5) or the component layer sequence (9) during cooling, which stresses lead to cracking. Since the semiconductor material (5) that has grown together forms a so-called coalescence region (6), having a high density of imperfections in the crystal lattice, these thermally governed cracks (13) are more likely to occur in this region. If the semiconductor bodies are singulated along these regions, these regions high in defects can be removed during the singulation, and a semiconductor body of high crystal quality can be mass produced.

36 Claims, 7 Drawing Sheets

FOREIGN PATENT DOCUMENTS

| | | | |
|---|---|---|---|
| EP | 0942459 A1 | | 9/1999 |
| EP | 10320160 A1 | * | 5/2003 |
| JP | 2000-174334 | | 6/2000 |
| JP | 2000174334 | * | 6/2000 |
| WO | 9963582 | * | 12/1999 |

OTHER PUBLICATIONS

Y. H. Song et al., "Lateral Epitaxial Overgrowth of GaN and its Crystallographic Tilt Depending on the Growth Condition", Phys. Stat. Sol. (a) 180, 247 (2000).

B. Beaumont et al., "Expitaxial Lateral Overgrowth of GaN", Phys. Stat. Sol. (b) 227 (2001), No. 1, pp. 1-43.

X. Li et al., "GaN Epitaxial Lateral Overgrowth and Optical Characterization", Applied Physics Letters (1998), vol. 73, No. 9, pp. 1179-1181.

L.D. Zhu et al., "Epitaxial Growth and Structural Characterization of Single Crystalline $ZnGeN_2$", MRS Internet J. Nitride Semicond. Res. 4S1, G3.8 (1999).

S. Nakamura et al., "The Blue Laser Diode" pp. 34-77, Springer-Verlag 1997.

* cited by examiner

METHOD FOR FABRICATING A PLURALITY OF SEMICONDUCTOR CHIPS

RELATED APPLICATIONS

This patent application claims the priority of German patent applications 103 19 573.4 and 103 27 612.2, the disclosure content of which is hereby incorporated by reference.

FIELD OF THE INVENTION

The invention relates to a method for fabricating a plurality of semiconductor chips, in particular based on nitride compound semiconductors, and to an electronic semiconductor body and an electronic component. It relates in particular to a method for fabricating radiation-emitting and/or radiation-detecting semiconductor chips for optoelectronic components and power transistor chips.

BACKGROUND OF THE INVENTION

Nitride compound semiconductor materials are compound semiconductor materials which contain nitrogen, such as materials from the system $In_xAl_yGA_{1-x-y}N$ where $0 \leq x \leq 1$, $0 \leq y \leq 1$ and $x+y \leq 1$. In the present instance, the group of radiation-emitting and/or radiation-detecting semiconductor chips based on nitride compound semiconductor material include in particular semiconductor chips in which the epitaxially fabricated semiconductor layer, which generally has a layer sequence comprising different individual layers, contains at least one individual layer which has a material from the nitride compound semiconductor material system. The semiconductor layer may for example have a conventional pn junction, a double heterostructure, a single quantum well structure (SQW structure) or a multiple quantum well structure (MQW structure). Structures of this type are known to the person skilled in the art and are therefore not explained in any more detail at this juncture.

It is known for a semiconductor material to be grown epitaxially on a substrate whose lattice constant is matched to the lattice constant of the semiconductor material in order to obtain an improved crystal quality and fewer crystal defects. A lattice-matched substrate which is also sufficiently suitable for the mass production of semiconductor chips of this type has not been disclosed heretofore in the case of the nitride compound semiconductor materials. Therefore, substrates based on sapphire, silicon carbide or spinel are frequently used, even though their lattice constant is not optimally matched to that of nitride compound semiconductor material.

An additional problem is that the epitaxial growth takes place for example at a temperature in the range of approximately 800° C. to approximately 1000° C. and is subsequently cooled for further processing. In this case, different thermal expansion coefficients of substrate material and semiconductor material layer grown thereon may lead to thermally induced mechanical stresses, with the result that there is the risk of damage to the semiconductor material layer due to cracks, for example. Conventionally, it is attempted to reduce this risk by matching the thermal expansion coefficients of the semiconductor material layer and of the substrate material to one another as well as possible.

Since the number of different materials suitable for the substrate is comparatively small in the case of nitride compound semiconductor materials, the aforementioned thermal matching is possible only to a limited extent, however. This means that, on the one hand, the maximum layer thickness that can be achieved for the semiconductor layer is limited and, on the other hand, the yield of semiconductor layers grown in a manner free of cracks is reduced.

These problems of limited layer thickness and yields also relate to semiconductor materials grown on the conventional substrates sapphire, spinel or silicon carbide. While the thermal matching between the semiconductor layer and the substrate is still relatively successful in the case of the material sapphire, for which reason nitride compound semiconductors of sufficient layer thickness can be grown on sapphire, only very thin layers made of nitride compound semiconductor materials having a maximum layer thickness of 3 to 4 µm can be grown epitaxially in a manner largely free of cracks on a substrate made of silicon carbide. Since it is intended to use the nitride compound semiconductors to fabricate optoelectronic components, in particular semiconductor lasers, and since these components may evolve a high thermal power loss depending on the individual case, the material sapphire is of only extremely limited suitability for the fabrication of power laser diodes, on account of its poor thermal conductivity. The use of silicon carbide as a substrate material has the advantage of a good thermal conductivity.

It is furthermore known to use special deposition methods for reducing the defect density in the semiconductor material. A method of this type is often referred to as the LEO method (lateral epitaxial overgrowth) or the ELOG method (epitaxial lateral overgrowth) and is disclosed for example in Song et al., Phys. Stat. Sol. (a) 180, 247 (2000), the content of which in this respect is hereby incorporated by reference. The fabrication of a gallium nitride layer on a sapphire substrate is described therein. First of all a thin initial layer (seed layer) is applied on the sapphire substrate and a strip-type silicon nitride mask layer is applied to said initial layer. During the subsequent deposition of trimethyl gallium and ammonia, first of all a plurality of gallium nitride layers grow between the mask strips. As soon as the gallium nitride layers have reached the thickness of the mask layer, the epitaxy parameters are set such that lateral growth occurs in addition to the vertical growth. Consequently, the mask layer is laterally overgrown by the gallium nitride layers. This process is continued until a closed gallium nitride layer is produced.

It has been found that the dislocation density in the gallium nitride layer fabricated by lateral overgrowth is advantageously low and is distinguished by a higher crystal quality in particular compared with a layer which is grown directly on the sapphire substrate.

However, comparatively large layer thicknesses (approximately 3–10 µm) are produced during these methods with coalescing ELOG layers, with the result that, in particular when using SiC substrates, the risk of cracking is very high and, consequently, it is only with difficulty that optoelectronic components with a sufficient quality can be fabricated.

SUMMARY OF THE INVENTION

One object of the present invention is to fabricate a plurality of semiconductor chips in such a way as to provide an improved yield and/or higher-quality semiconductor chips.

Another object of the present invention is to provide an electronic semiconductor body which can be fabricated in mass production and having an improved crystal quality compared with the crystal qualities that can conventionally be achieved in mass production.

These and other objects are attained in accordance with one aspect of the present invention directed to a method for fabricating a plurality of semiconductor bodies, which comprises forming a mask layer on a substrate, which mask layer has a plurality of windows to the substrate, thus giving rise to uncovered locations of the substrate. A semiconductor material is grown onto the uncovered locations of the substrate in such a way that it grows over the mask layer and then grows together over the mask layer between adjacent windows where it forms a coalescence region. A component layer sequence is grown onto the semiconductor material. The composite comprising substrate, mask layer, semiconductor material and component layer sequence is singulated into individual semiconductor chips along the coalescence regions.

A method according to an embodiment of the invention has the following method steps. A mask layer is applied to a substrate, which mask layer has a plurality of windows to the substrate and onto which mask layer a semiconductor material that is to be deposited on the substrate can be deposited only very poorly or not at all. The semiconductor material is grown, for example as an individual layer or as a layer structure having a plurality of different layer constituents and/or successively applied layers, onto the substrate in such a way that the semiconductor material grows over the mask layer, proceeding from the windows, and in each case grows together over the mask layer between adjacent windows, where it forms a coalescence region. A component layer sequence is grown onto the semiconductor material. The composite comprising substrate, mask layer, semiconductor material and component layer sequence is separated at the coalescence regions.

The substrate material can be chosen such that the thermal expansion coefficient of the substrate is much lower than the thermal expansion coefficient of the semiconductor material or the component layer sequence. This may be utilized to generate thermally governed cracks at least in the component layer sequence, which continue into the semiconductor material and may reach as far as the mask layer or even as far as the substrate. For this purpose, the tensile stresses, arising during cooling on account of different thermal expansion coefficients, in the semiconductor material and in the component layer sequence are utilized in order to produce cracks in a targeted manner at predetermined locations. The tensile stresses in the semiconductor material or in the component layer sequence ensure that, after cracks occur, the crack widths are increased and the cracks penetrate more deeply into the semiconductor material or the component layer sequence. The cracks preferably reach as far as the mask layer.

In one embodiment, a substrate is used whose thickness is greater than the total layer thickness of the semiconductor material together with the component layer sequence. What is thereby achieved is that cracks arise in the semiconductor material or in the component layer sequence.

Materials such as silicon, silicon carbide, spinel or sapphire are examples of suitable substrate materials. It is possible to use a substrate made of silicon or a silicon-containing substrate. The silicon is cost effective and has a significantly lower thermal expansion coefficient relative to many other semiconductor materials.

An ELOG method can be used to grow the semiconductor material. A coalescence region is formed in the semiconductor material as a result of the lateral growth and the growing together of semiconductor material from separate regions of the substrate. The coalescence region is that region in which the growing layers from at least two different adjacent windows meet and grow together.

Such a coalescence region has a higher dislocation density, in particular. The coalescence regions bring about corresponding defect regions in the component layer sequence.

The method according to an embodiment of the invention utilizes the coalescence regions and/or the defect regions as weak points in the composite as crack zones. During the cooling of the composite comprising substrate, mask layer, semiconductor material and component layer sequence, cracks can arise in coalescence regions and/or defect regions. Thus, the regions of the composite which are intended for the finished components are preserved as far as possible. This leads to an improvement of the yield of high-quality epitaxial layers. The combination of an improved semiconductor yield and the possibility of using cheaper substrates such as silicon makes the method according to the invention particularly cost effective for mass production.

During the lateral growth of the semiconductor material over the mask layer, a gap can form between the mask layer and the semiconductor material, which gap, after the growing together of the semiconductor-material from adjacent windows, leads to a cavity between the mask layer and the semiconductor material. Such cavity supports the later singulation process in that it supports the stress relief of the composite after the cracks occur.

The semiconductor material and/or the component layer sequence can be grown by means of an MOVPE method. This gives rise first of all to a plurality of structures which are similar to a pyramid, like a pyramid, similar to a truncated pyramid and/or like a truncated pyramid on the substrate. Growth in the facet direction of these structures is achieved by suitably setting the growth conditions, i.e. the principle growth of the semiconductor material essentially takes place in a direction running perpendicular to the facets of the structures. Accordingly, the regions between the structures which are similar to a pyramid are filled by lateral growth, which ultimately leads to the semiconductor material growing together over the mask layer of intermediate adjacent windows.

The semiconductor material can have a largely planar surface after growing together. This can provide a largely lattice-matched semiconductor material with few crystal imperfections or defects as a basis for the growth of the component layer sequence.

In order that this growth basis is as far as possible not disturbed, it is preferable for a change in temperature which could lead to cracking in the semiconductor material not to be carried out between method steps (b) and (c).

During the cooling of the composite to a temperature which is suitable for the further processing thereof, which may be effected before method step (d), the cracks generally arise in the defect regions of the component layer sequence, which support the singulation of the composite. Therefore, singulation is effected along said defect regions. In this case, singulation takes place along each coalescence region between the openings of the mask layer. In this way, a plurality of semiconductor bodies are fabricated, the number of which corresponds to the number of windows in the mask layer.

In one embodiment, prior to the growth of the semiconductor material, a buffer layer is applied to the substrate. Said buffer layer is used, inter alia, to improve the crystal quality of the semiconductor material. The buffer layer may be applied to the substrate before or after the application of the mask layer. If the buffer layer is applied before the mask layer, this is effected over the entire area on the substrate. The mask layer is applied to the buffer layer in this case. By contrast, if it is applied after the mask layer, this is effected for example only in the windows of the mask layer 3 on the substrate.

One embodiment uses a mask layer containing silicon nitride.

In a further embodiment, the mask layer has a lattice-like or mesh-like structure. The windows in this lattice-like or mesh-like mask layer preferably correspond to the desired chip grid. The windows of the mask layer may be formed in triangular, quadrangular, circular and/or hexagonal fashion. Other forms and configurations of the windows are likewise possible.

The webs forming the lattice structure preferably have a width which is of the order of magnitude of the width of the separating structures for the singulation of the composite comprising substrate, semiconductor material and component layer sequence. Separating structures are structures which support the singulation process, such as sawing trenches, etching trenches or other regions of the composite which are sacrificed for the singulation.

In one embodiment, in each case at least one crack initiator is produced in the defect regions from the surface of the component layer sequence which is remote from the substrate. The crack initiators are produced before the cooling of the composite in-situ by means of selective etching.

In a further embodiment, prior to the singulation, the crack regions, coalescence regions and/or defect regions are removed by means of etching. As an alternative, these regions may be removed after the singulation.

The semiconductor material may have a single epitaxial layer or a plurality of epitaxial layers made of different semiconductor compounds.

The component layer sequence can contain at least one active region, which emits electromagnetic radiation.

The electronic semiconductor body is an optoelectronic, in particular a radiation-emitting semiconductor chip. The method is particularly suitable for fabricating light-emitting diodes or laser diodes.

The method is particularly suitable for the growth of a component layer sequence which contains a compound of elements from the third and fifth main groups, particularly a nitride compound semiconductor material such as, for example, GaN, AlN, InGaN, AlGaN, AlInN and/or AlInGaN. The semiconductor material is formed as a semiconductor layer or a semiconductor layer sequence. The semiconductor material and/or the component layer sequence are grown epitaxially.

DETAILED DESCRIPTION OF THE DRAWINGS

In the exemplary embodiments and figures, identical or identically acting constituent parts are in each case provided with the same reference symbols. The layer thicknesses illustrated are not to be regarded as true to scale. Rather, for the purpose of better understanding, the illustration shows them with exaggerated thicknesses and not with the actual thickness ratios with respect to one another.

During the method sequence illustrated diagrammatically in FIGS. 1a to 1i, first of all a mask layer 3 is fabricated on a substrate 1. The mask layer has a lattice structure with the desired grid of semiconductor chips to be fabricated. The substrate 1 is composed for example of silicon carbide or of silicon. The mask layer 3 may be composed of a dielectric material such as e.g. silicon nitride. What is important is that a semiconductor material 5 to be deposited on the substrate 1 cannot be deposited, or can be deposited only very poorly, onto the mask layer 3. The mask layer 3 preferably has triangular windows 4, given by lattice openings, toward a layer lying below the mask layer 3, toward the substrate in the present case (cf. FIGS. 4a and 4c), with the result that uncovered locations of the substrate are present. Other configurations, such as, for example, circular, hexagonal, quadrangular or differently polygonal lattice openings (cf. FIG. 4b) are also conceivable.

The windows 4 essentially determine the form and edge length of the semiconductor chips to be fabricated, that is to say the chip grid, that is to say the edge length of the chips. Triangular semiconductor chips are fabricated in the present case.

Figure 1A:
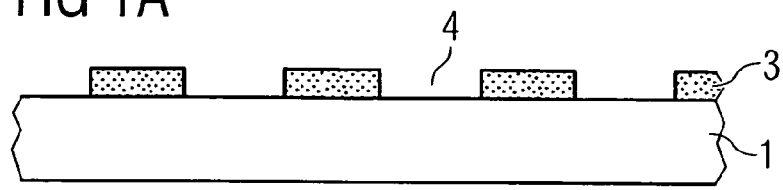
FIGS. 1a to 1i show a diagrammatic illustration of a method sequence in accordance with a first exemplary embodiment.
Figure 1B:
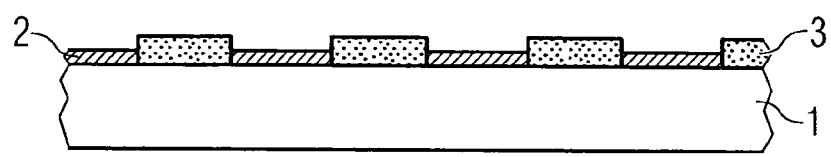

A thin buffer layer 2, which is composed for example of gallium nitride and has a thickness of 2 μm for example, may be applied in the windows 4 (cf. FIG. 1b). Such a buffer layer is often referred to as a seed layer. However, such a buffer layer 2 is not essential and may be dispensed with.

Figure 1C:
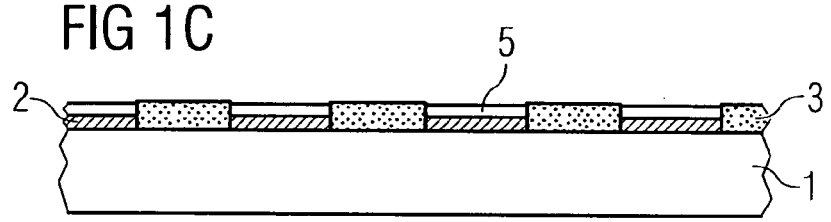

The semiconductor material 5, for example having the composition $In_xAl_yGa_{1-x-y}N$ where $0 \leq x \leq 1$, $0 \leq y \leq 1$ and $x+y \leq 1$, preferably GaN or AlGaN with a very low Al content (e.g. less than 5% on the Ga site), is grown onto the buffer layer 2 in the windows 4 for example by means of metal organic vapor phase epitaxy (MOVPE) (cf. FIG. 1c). First of all, three-dimensional structures, preferably structures that are like or similar to a pyramid, are grown onto the buffer layer 2. In this case, the growth temperature is approximately 1000° C. The further growth conditions for the growth of such structures are known to the person skilled in the art for example from S. Nakamura et al., The Blue Laser Diode, Springer-Verlag, 1997 and are therefore not explained in any further detail at this juncture.

The growth conditions are subsequently set (for example changed growth pressure, changed V/III ratio, changed growth temperature and/or introduction of $Cp_2Mg$ and/or TMIn), such that a lateral growth in the facet direction of the three-dimensional structures is predominant and the structures that are similar to a pyramid are planarized to the greatest possible extent.

Methods for lateral growth are described for example in the documents Phys. Stat. Sol. (b) 227(2001), No. 1, pp. 1–43, Applied Physics Letters (1998), Vol. 73. Number 9, p. 1179–1181, Phys. Stat. Sol. (a) 180(2000), pp. 247–250 and MRS Internet J. Nitride Semicond. Res. 4S1, G3.38 (1999), which are in this respect hereby incorporated by reference.

Figure 1D:
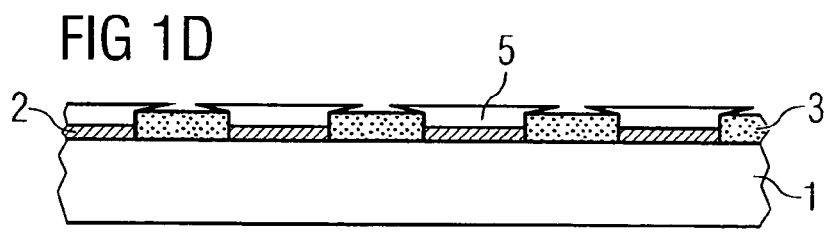
Figure 1E:
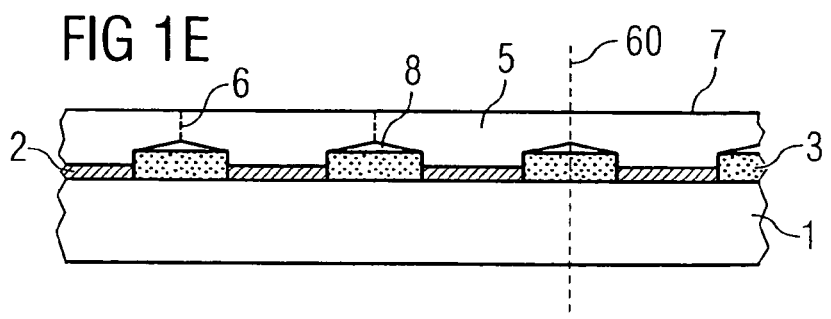
Figure 1F:
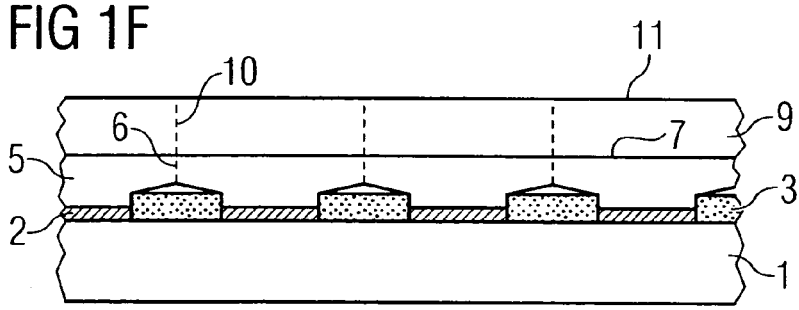

This lateral growth is illustrated in FIGS. 1d and 1e. The semiconductor material 5 grows from the windows 4 and grows over the mask layer 3 as the growth progresses further. A gap 8 arises between the mask layer 3 and the semiconductor material 5 (cf. FIGS. 1*d* and 1*e*). The semiconductor material 5 from adjacent windows 4 grows together over the mask layer 3. The gap 8 is illustrated with an exaggerated size in the figures. Coalescence regions 6 (indicated by broken lines) are formed in the regions over the mask layer 3 in which the semiconductor material 5 from adjacent windows 4 has grown together (FIG. 1*e*). The separating lines (indicated by the broken line 60) for the later singulation of a layer composite fabricated on the substrate 1 run through said coalescence regions.

Other epitaxial growth methods which enable ELOG or a similar growth may alternatively be provided. The coalescence region 6 has an increased defect density compared with the rest of the semiconductor material.

During the later cooling process, this preferably leads to cracking in these regions, since there is no homogeneous distribution of forces in the volume here on account of the crystal imperfections.

After the growing together process a preferably planar or largely planar surface 7 of the semiconductor material 5, which is suitable for a component layer sequence 9 to grow on, is formed by further growth of semiconductor material 5. The component layer sequence 9 is subsequently grown on this surface 7 of the semiconductor material 5 that is remote from the substrate 1 (FIG. 1*f*), preferably without a change in temperature which could cause cracking in the semiconductor material 5 taking place beforehand. During the growth of the component layer sequence 9, the crystal imperfections propagate from the coalescence regions 6 of the semiconductor material 5 into the component layer sequence 9. These crystal imperfections bring about defect regions 10 corresponding to the respective coalescence regions 6 in the component layer sequence.

The thermal expansion of the substrate material is less than the thermal expansion of the semiconductor material 5 or the component layer sequence 9. In addition to the materials SiC and silicon already mentioned further above, sapphire, for example, is also a suitable substrate material for certain semiconductor material systems.

Figure 1G:
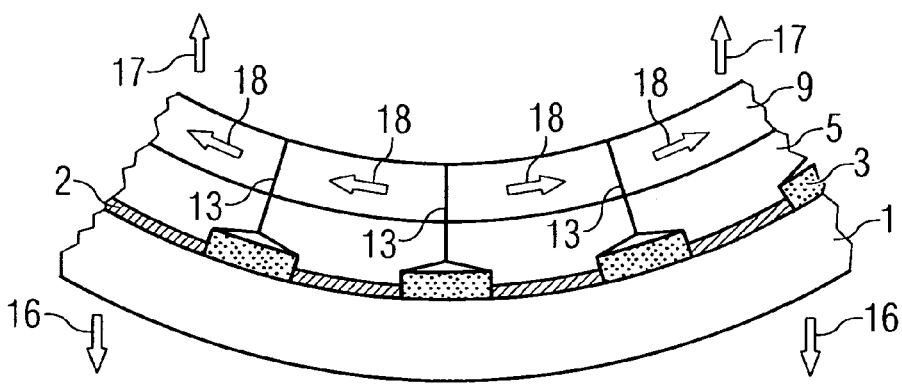
Figure 1H:
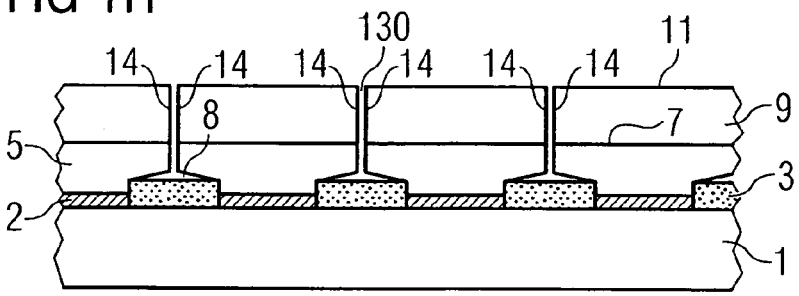
Figure 1I:
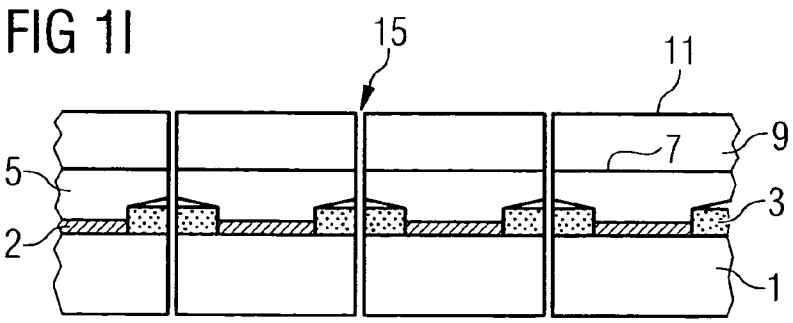

The state of the composite comprising substrate 1, mask layer 3, semiconductor material 5 and component layer sequence 9 during cooling is shown exaggerated in FIG. 1*g*. The different thermal expansions of substrate 1 and semiconductor material 5 and component layer sequence 9 cause the composite to curve. To be precise, the different thermal expansions cause the composite to curve in such a way that the composite is concave on the side of the component layer sequence 9 and convex on the side of the substrate 1. The forces which are responsible for this are indicated by the arrows 16 and 17 in FIG. 1*g*. Tensile stresses, indicated by the arrows 18 in FIG. 1*g*, therefore occur in the semiconductor material 5 and in the component layer sequence 9.

The magnitude of the tensile stresses for example in the component layer sequence is dependent inter alia on the difference in the thermal expansions of substrate and semiconductor material/component layer sequence. The greater this difference is, the greater are, as a rule, the tensile stresses.

The thickness of the substrate 1 lies between 100 μm and 500 μm, for example, and the total thickness of the semiconductor material 5 and the component layer sequence 9 lies between 2 μm and 20 μm, for example.

The tensile stresses cause cracks 13 in the semiconductor material 5 and in the component layer sequence 9, to be precise preferably in the defect regions 10. These regions are removed at least for the most part in the course of the singulation of the composite into individual semiconductor bodies. The cracks 13 preferably occur in regions of the semiconductor material 5 and of the component layer sequence 9 which are virtually or completely unimportant for the performance or quality of the later semiconductor bodies, which in most cases are even removed from the composite in further method steps.

If the cracks 13 reach as far as the gap 8, the stress on the composite is relieved (cf. FIG. 1*h*) and open gaps 130 reaching as far as the mask layer 3 are produced in the component layer sequence 9 and in the semiconductor material 5. The regions of the semiconductor material 5 and of the component layer sequence 9 which directly adjoin such a crack are referred to as crack regions 14.

The composite may then be singulated to form semiconductor bodies according to conventional methods, for example by cutting through the mask layer 3 and the substrate 1. The mask layer 3 may be removed completely or only partially during the singulation. Semiconductor bodies with or without residues of the mask layer 3 are possible.

Optionally, the crack regions 14, coalescence regions 6 and/or the defect regions 10 may be removed by means of etching prior to the singulation of the composite.

Unless indicated otherwise, the above explanations relating to the first exemplary embodiment also apply to the further exemplary embodiments.

FIGS. 2*a* to 2*e* diagrammatically illustrate the first method steps of an alternative method sequence in accordance with a second exemplary embodiment. The second exemplary embodiment differs from the first exemplary embodiment in particular by the fact that the buffer layer 2 is applied to the substrate 1 before the application of the mask layer 3.

Figure 2A:
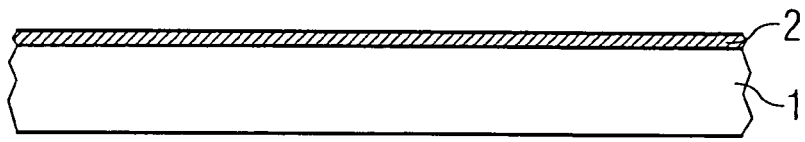
FIGS. 2a to 2e show a diagrammatic illustration of a method sequence in accordance with a second exemplary embodiment.
Figure 2B:
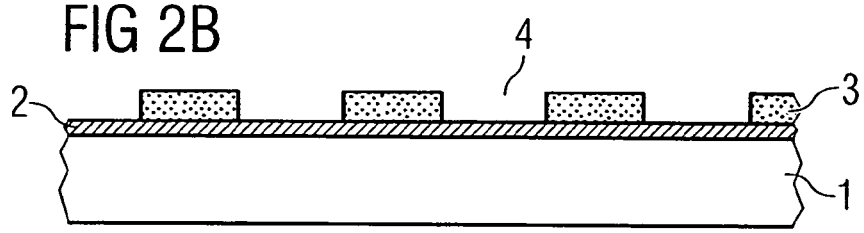
Figure 2C:
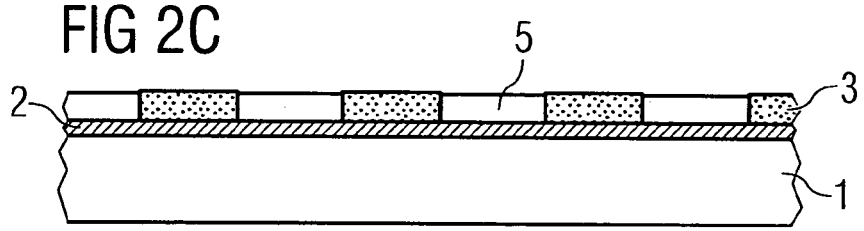
Figure 2D:
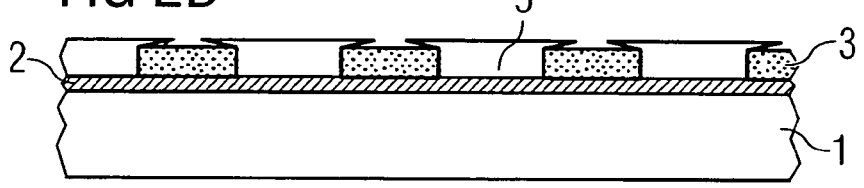

As illustrated in FIG. 2*a*, first of all a buffer layer 2 is applied over the area of the substrate 1, for example by means of an epitaxy method. The mask layer 3 is applied to the buffer layer 2. The mask layer 3 may be patterned by means of phototechnology. As in the first exemplary embodiment, the mask layer 3 may have a lattice-like or mesh-like structure. The mask layer 3 consequently has windows 4 to the buffer layer 2.

Figure 2E:
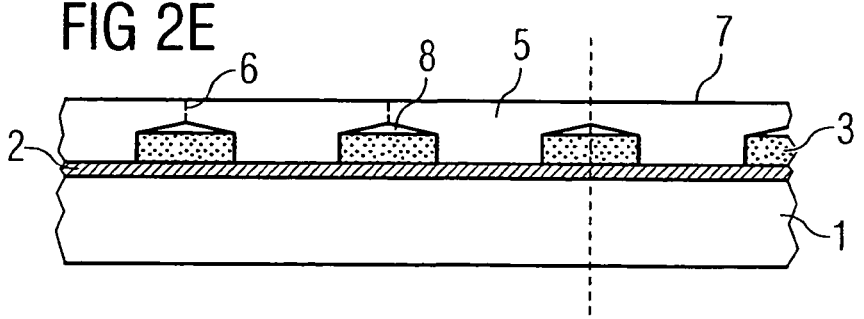

As in the first exemplary embodiment, the semiconductor material 5 is grown onto the buffer layer 2 (FIG. 2*c*) and the mask layer 3 is laterally overgrown (FIG. 2*d*) until the semiconductor material 5 has a suitable, preferably planar surface 7 for the growth of the component layer sequence (FIG. 2*e*).

The remaining method steps take place analogously to the exemplary embodiment in accordance with FIGS. 1*a* to 1*i*.

Figure 3A:
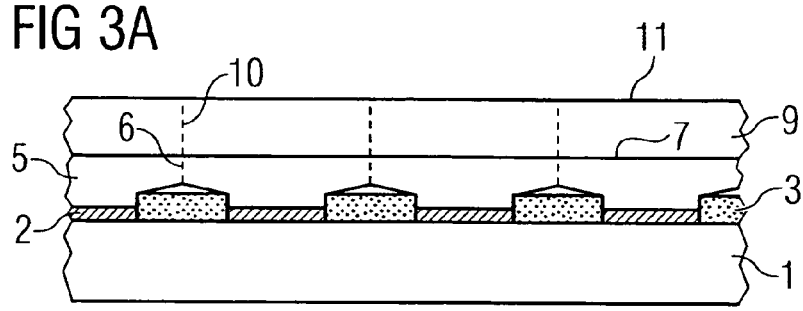
FIGS. 3a to 3d show a diagrammatic illustration of a method sequence in accordance with a third exemplary embodiment, and FIGS. 4a to 4c in each case show a perspective illustration of a section of a substrate and a patterned mask layer at a method stage of the first exemplary embodiment.
Figure 3B:
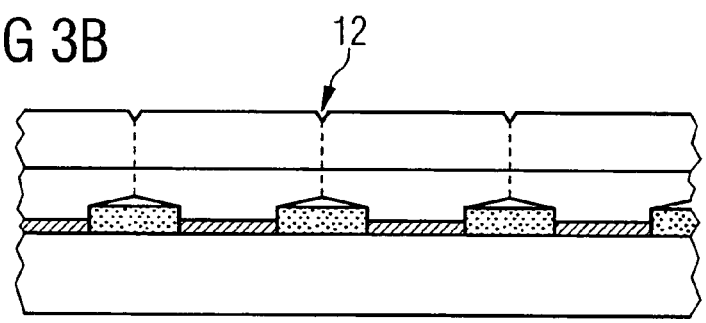
Figure 3C:
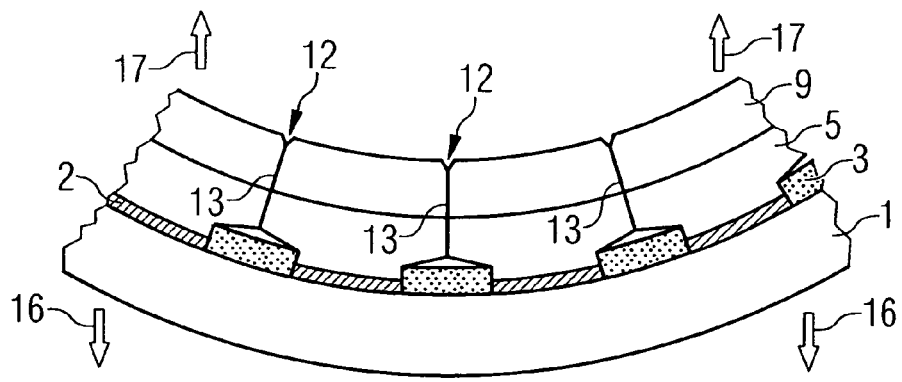

In order to better control the occurrence of cracks during cooling or in order to determine the location of cracks more reliably, crack initiators 12 may be produced in the composite (FIG. 3*a*), preferably before the cooling to the singulation temperature. Crack initiators 12 are preferably produced in the defect region 10 in the surface 11 of the component layer sequence 9 that is remote from the substrate 1 (FIG. 3*b*). Such crack initiators 12 are produced adjacent to imperfections in the lattice structure of the component layer sequence 9 on the surface 11 and represent a weak point in the component layer sequence 9. The crack initiators 12 may be produced in a targeted manner in the defect region 10. They support a targeted formation of cracks 13 exactly in the defect regions 10 and reduce the risk of cracks at other locations of the semiconductor material 5 or in the component layer sequence 9.

The crack initiators 12 are preferably produced before a change in temperature is effected which may lead to cracking in the semiconductor material 5 or in the component layer sequence 9. The crack initiators 12 are produced for example by selective etching, in particular by selective in-situ etching in the epitaxy reactor. They may in each case be continuous (for example as continuous trenches) in the defect regions 10 or be formed as interrupted structures along the defect regions 10, for example as mutually separate trenches or holes having different cross sections. The crack initiators 12, which can be seen in FIG. 3b, are preferably formed as continuous trenches with a for example wedge-shaped cross section. Other cross sections of the crack initiators are conceivable and may depend on the type of production and/or on the material.

Figure 3D:
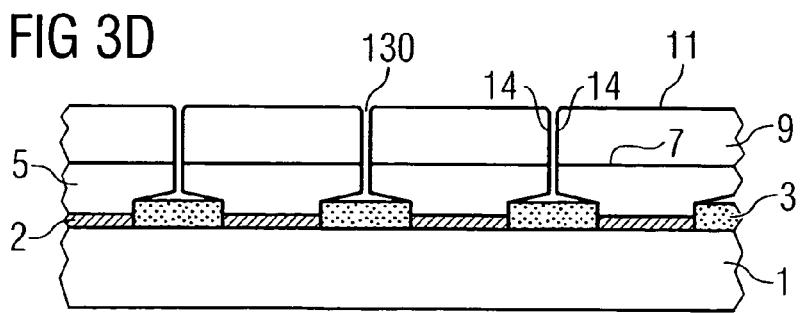

The composite, the stress of which is relieved after the occurrence of the cracks 13 and gaps 130, is illustrated in FIG. 3d. The composite may then be processed further and singulated as already described further above in connection with the first exemplary embodiment.

Figure 4A:
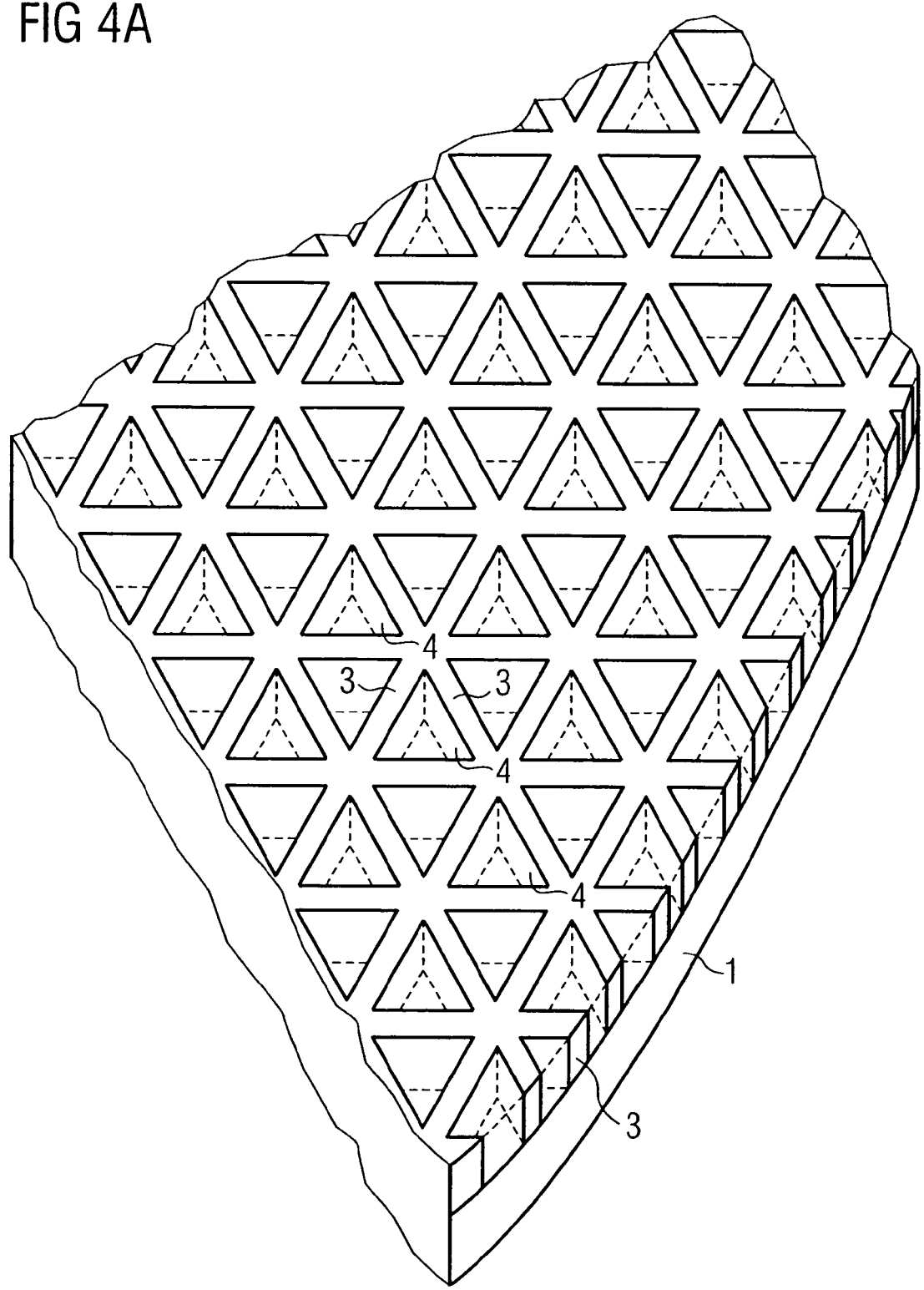
Figure 4B:
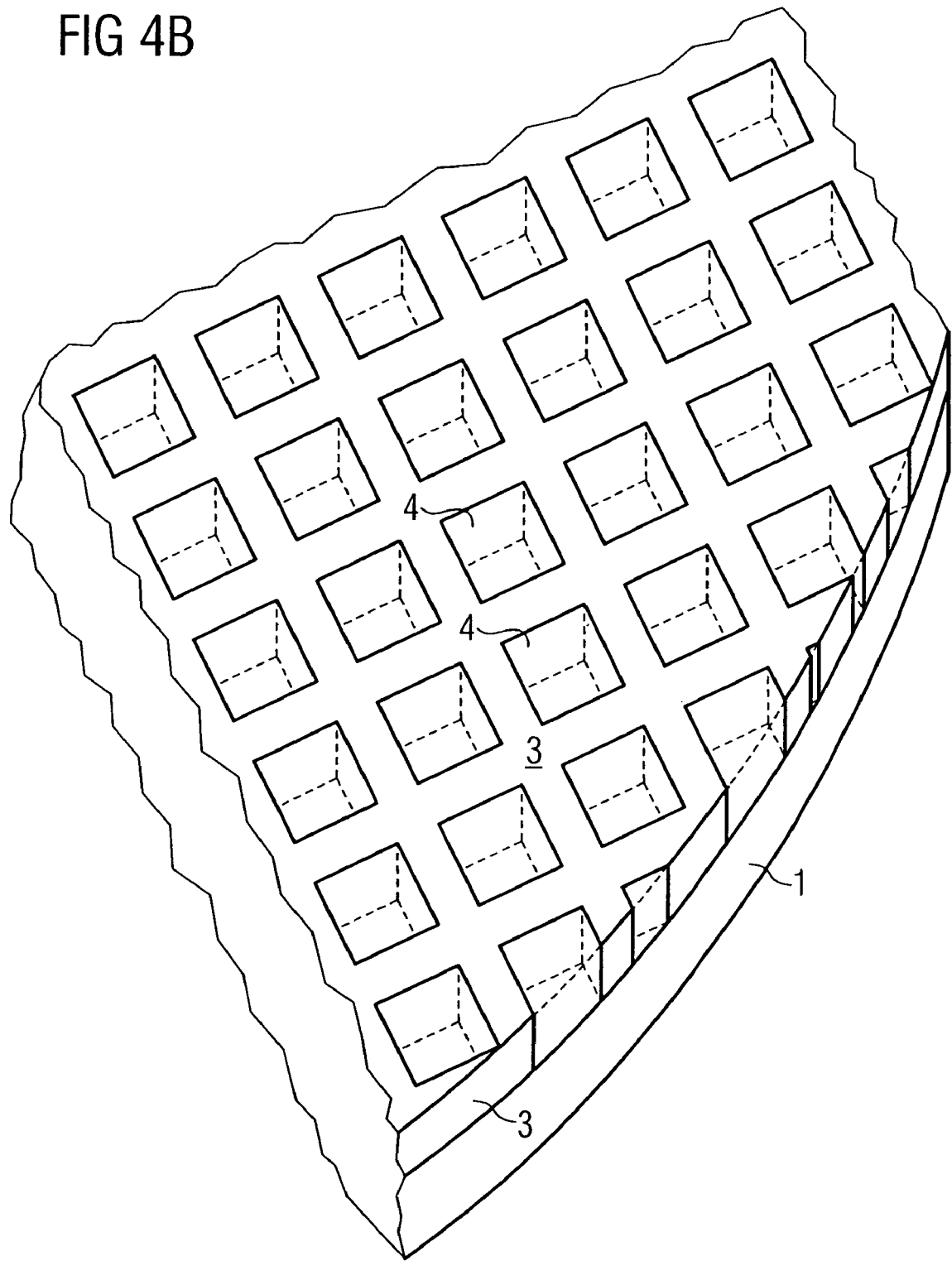
Figure 4C:
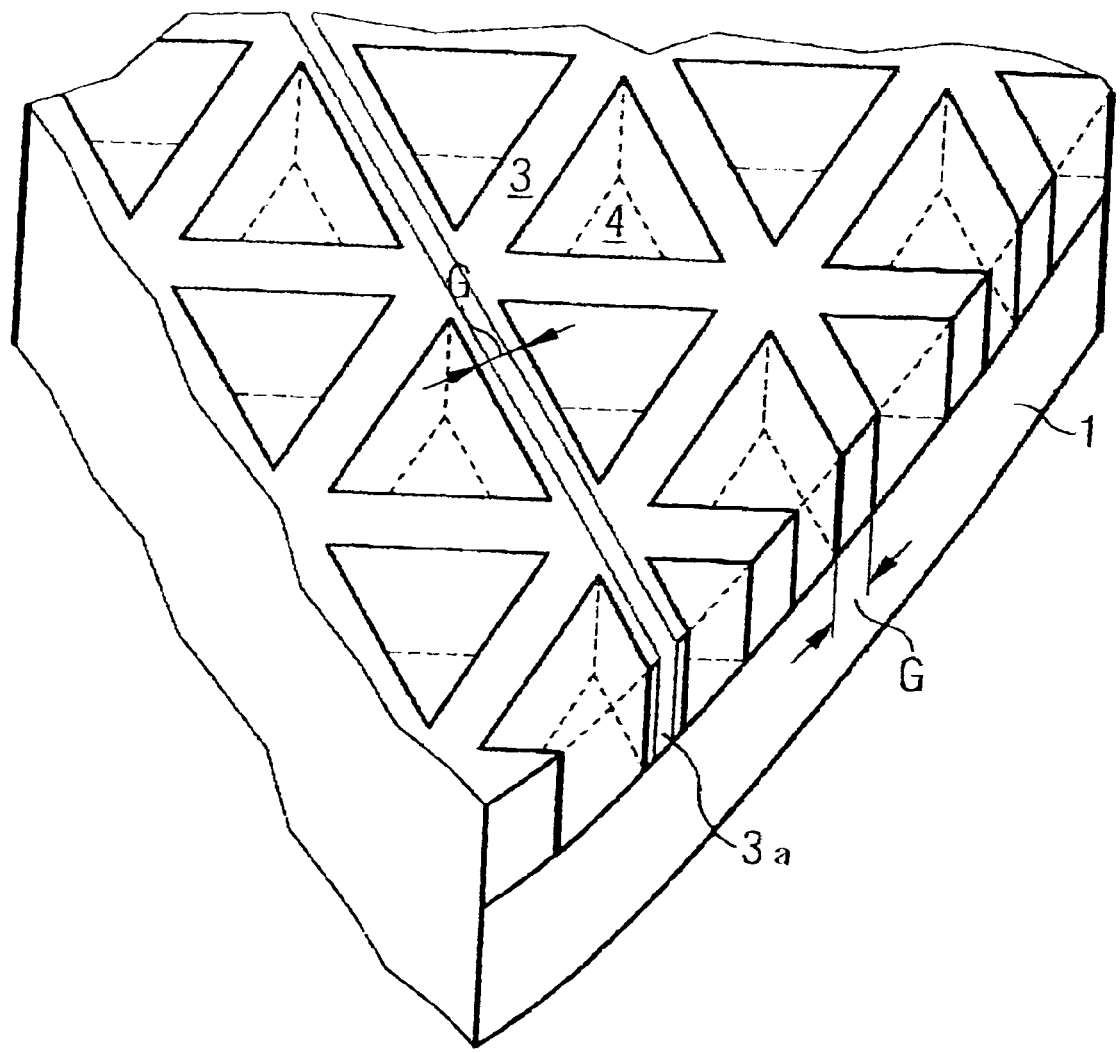

FIGS. 4a and 4b show two examples of a patterned mask layer 3 on a substrate 1 (cf. FIG. 1a). FIG. 4c is an enlarged detail from the structure of FIG. 4a. Triangular windows are preferably used for fabricating nitride compound semiconductor structures. Triangular windows are suitable in particular for GaN-based materials since the crystal structure of GaN is hexagonal. If GaN is grown with the c axis perpendicular to the substrate surface, a trigonal symmetry arises in the direction of the c axis. The cleavage faces form an angle of 60° (or approximately 60°). During cooling of the GaN, cracks corresponding to said trigonal symmetry generally occur on account of the crystal structure. Therefore, triangular windows are particularly preferred. GaN is preferably grown with the c axis perpendicular to the substrate surface in the method according to the invention.

The triangular windows 4 in accordance with FIG. 4a essentially correspond to the plan form of the envisaged semiconductor bodies after singulation. The lattice structure of the mask layer 3 accordingly corresponds to the chip grid on the composite comprising substrate 1, semiconductor material and component layer sequence.

Between the windows 4, there are formed webs of the mask layer, the width G of which in this case corresponds at least to the width of the separating structures 3a (FIG. 4c). Separating structures 3a are sawing or etching trenches, for example, which are produced for or during the singulation. As an alternative, the width of the webs may be greater or less than that of the separating structures 3a.

Semiconductor bodies of high crystal quality can be fabricated with the aid of the method according to the invention. Moreover, the production yield can be improved in that regions of the semiconductor material that are high in defects or unusable are sacrificed for the singulation process and are removed in this case.

It goes without saying that the description of the method on the basis of the exemplary embodiments is not to be understood as a restriction of the invention thereto. Rather, the method can also be used in other material systems in which similar problems exist.

The invention is not restricted by the description on the basis of the exemplary embodiments. Rather, the invention encompasses any new feature and also any combination of features, which in particular comprises any combination of features in the patent claims, even if said feature or said combination itself is not explicitly specified in the patent claims or exemplary embodiments.

What is claimed is:

1. A method for fabricating a plurality of semiconductor bodies, comprising the steps of:
    (a) forming a mask layer on a substrate, which mask layer has a plurality of windows to the substrate, thus giving rise to uncovered locations of the substrate;
    (b) growing a semiconductor material onto the uncovered locations of the substrate in such a way that it grows over the mask layer and then grows together over the mask layer between adjacent windows where it forms a coalescence region;
    (c) growing a component layer sequence onto the semiconductor material; and
    (d) singulating the composite comprising substrate, mask layer, semiconductor material and component layer sequence into individual semiconductor chips along each coalescence region.

2. The method as claimed in claim 1, wherein a change in temperature which might lead to cracking in the semiconductor material is avoided between steps (b) and (c).

3. The method as claimed in claim 1, wherein the substrate comprises a material whose thermal expansion coefficient is less than the expansion coefficient of the semiconductor material and/or the component layer sequence.

4. The method as claimed in claim 1, wherein the thickness of the substrate is greater than the total thickness of the semiconductor material and the component layer sequence.

5. The method as claimed in claim 1, wherein, before step step (d) the composite is cooled below the growth temperature.

6. The method as claimed in claim 5, wherein thermally induced cracks occur during cooling in the semiconductor material and/or in the component layer sequence.

7. The method as claimed in claim 1, wherein the semiconductor material has a plurality of layers of different compositions.

8. The method as claimed in claim 1, wherein, before step (a), a buffer layer is applied to the substrate and the windows of the mask layer are formed toward the buffer layer and the semiconductor material is grown in the windows on the buffer layer.

9. The method as claimed in claim 1, wherein, after step (a), a buffer layer is applied to the substrate in the windows of the mask layer and the semiconductor material is subsequently grown in the windows on the buffer layer.

10. The method as claimed in claim 1, wherein the semiconductor material is grown on using an ELOG technique.

11. The method as claimed in claim 1, wherein the semiconductor material and/or the component layer sequence is grown on by means of an MOVPE method.

12. The method as claimed in claim 11, wherein, in step (b), a plurality of three-dimensional structures are grown on in the windows.

13. The method as claimed in claim 11, wherein, in step (b), a plurality of three-dimensional structures are grown on in the windows, which structures have one of the following forms: a pyramid shape or a truncated pyramid shape.

14. The method as claimed in claim 13, wherein the growth is set in such a way that it essentially takes place in a direction which is perpendicular to the facets of the three-dimensional structures.

15. The method as claimed in claim 1, wherein the semiconductor material grown on in step (b) has a largely planar surface.

16. The method as claimed in claim 1, wherein gaps arise between the mask layer and the semiconductor material deposited in step (b).

17. The method as claimed in claim 1, wherein the mask layer has a lattice-like or mesh-like structure.

18. The method as claimed in claim 17, wherein the windows in the lattice-like mask layer define a chip grid.

19. The method as claimed in claim 1, wherein the windows are formed in step (a) in one of the following forms: triangular, quadrangular, circular or hexagonal.

20. The method as claimed in claim 1, wherein the form and size of the windows determine the contour and size of the semiconductor bodies to be fabricated.

21. The method as claimed in claim 1, wherein webs of the mask layer are provided between the windows and the web widths are of the order of magnitude of the width of separating structures for singulation of the composite.

22. The method as claimed in claim 21, wherein the separating structures are sawing trenches.

23. The method as claimed in claim 1, wherein, after step (c), crack initiators are produced on the surface of the component layer sequence remote from the substrate, in defect regions.

24. The method as claimed in claim 23, wherein the crack initiators are produced before a change in temperature takes place which may lead to cracking in the semiconductor material and/or the component layer sequence.

25. The method as claimed in claim 1, wherein the component layer sequence and the semiconductor material are removed after the cooling of the composite in the vicinity of a coalescence region.

26. The method as claimed in claim 1, wherein, after step (d), a residual coalescence region and/or defect region are/is removed by means of etching.

27. The method as claimed in claim 1, wherein the mask layer contains silicon nitride.

28. The method as claimed in claim 1, wherein the semiconductor material and/or the component layer sequence contains a compound of elements from the third and fifth main groups.

29. The method as claimed in claim 1, wherein the semiconductor material and/or the component layer sequence contains a nitride compound semiconductor material.

30. The method as claimed in claim 1, wherein the semiconductor material and/or the component layer sequence contains a material based on $In_xAl_yGA_{1-x-y}N$ where $0 \leq x \leq 1$, $0 \leq y \leq 1$ and $x+y \leq 1$.

31. The method as claimed in claim 1, wherein the substrate contains silicon, silicon carbide and/or sapphire.

32. An electronic semiconductor body, wherein the semiconductor body is fabricated according to the method as claimed in claim 1.

33. The electronic semiconductor as claimed in claim 32, wherein the electronic semiconductor is a radiation-emitting semiconductor chip.

34. The electronic semiconductor body as claimed in claim 32, wherein the electronic semiconductor body forms one of the following radiation-emitting semiconductor chips: a light-emitting diode chip or a laser diode chip.

35. A method for fabricating a plurality of semiconductor bodies, comprising the steps of:
(a) forming a mask layer on a substrate, which mask layer has a plurality of windows to the substrate, thus giving rise to uncovered locations of the substrate;
(b) growing a semiconductor material onto the uncovered locations of the substrate in such a way that it grows over the mask layer and then grows together over the mask layer between adjacent windows where it forms a coalescence region;
(c) growing a component layer sequence onto the semiconductor material;
(c1) producing, in defect regions, crack initiators on the surface of the component layer sequence remote from the substrate by selective in-situ etching in the epitaxy reactor; and
(d) singulating the composite comprising substrate, mask layer, semiconductor material and component layer sequence into individual semiconductor chips along each coalescence region.

36. A method for fabricating a plurality of semiconductor bodies, which comprises the steps of:
(a) forming a mask layer on a substrate, which mask layer has a plurality of windows to the substrate and onto which mask layer a semiconductor material that is to be grown on to the substrate in a later method step can grow significantly less well in comparison with the substrate;
(b) growing the semiconductor material onto the substrate in such a way that it grows over the mask layer, proceeding from the windows, and then grows together over the mask layer between adjacent windows, where it forms a coalescence region;
(c) growing a component layer sequence onto the semiconductor material; and
(d) singulating the composite comprising substrate, mask layer, semiconductor material and component layer sequence into individual semiconductor chips along each coalescence region.

* * * * *